(12) United States Patent
Shin et al.

(10) Patent No.: US 11,108,401 B2
(45) Date of Patent: Aug. 31, 2021

(54) LOW NOISE QUADRATURE SIGNAL GENERATION

(71) Applicant: Xilinx, Inc., San Jose, CA (US)

(72) Inventors: Jaewook Shin, San Jose, CA (US); Parag Upadhyaya, Los Gatos, CA (US); Shaojun Ma, San Jose, CA (US)

(73) Assignee: XILINX, INC., San Jose, CA (US)

(*) Notice: Subject to any disclaimer, the term of this patent is extended or adjusted under 35 U.S.C. 154(b) by 3 days.

(21) Appl. No.: 16/688,130

(22) Filed: Nov. 19, 2019

(65) Prior Publication Data

US 2021/0152180 A1 May 20, 2021

(51) Int. Cl.
| | |
|---|---|
| H03L 7/24 | (2006.01) |
| H03K 3/03 | (2006.01) |
| H03L 7/099 | (2006.01) |
| G06F 1/08 | (2006.01) |
| H03B 5/12 | (2006.01) |
| H04L 7/033 | (2006.01) |
| H03L 7/083 | (2006.01) |
| H04L 27/00 | (2006.01) |
| H03F 3/24 | (2006.01) |
| H03F 3/21 | (2006.01) |

(52) U.S. Cl.
CPC .............. *H03L 7/24* (2013.01); *G06F 1/08* (2013.01); *H03B 5/1228* (2013.01); *H03F 3/211* (2013.01); *H03F 3/245* (2013.01); *H03K 3/0315* (2013.01); *H03L 7/083* (2013.01); *H03L 7/0995* (2013.01); *H04L 7/033* (2013.01); *H04L 27/00* (2013.01)

(58) Field of Classification Search
CPC .......... H03F 3/245; H03F 3/211; H04L 27/00; H04L 7/033; H03L 7/24; H03L 7/083; H03L 7/0995; H03B 5/1228; G06F 1/08; H03K 3/0315

USPC .............. 455/76, 73, 78, 86, 255, 259, 260; 375/297, 324, 130, 147, 316, 346; 331/57

See application file for complete search history.

(56) References Cited

U.S. PATENT DOCUMENTS

| | | | |
|---|---|---|---|
| 10,237,052 B1* | 3/2019 | Moscone | H04L 7/0025 |
| 2020/0259540 A1* | 8/2020 | Walling | H03F 3/195 |

OTHER PUBLICATIONS

Song Sanquan et al, "A 2-to-20 GHz Multi-Phase Clock Generator with Phase Interpolars Using Injection-Locked Oscillation Buffers for High-Speed IOs in 16nm FinFET", 2019 IEEE Custom Integrated Ciruicts Conference (CICC), IEEE, Apr. 14, 2019, pp. 1-4.

(Continued)

*Primary Examiner* — Arnold M Kinkead
(74) *Attorney, Agent, or Firm* — Patterson + Sheridan, LLP

(57) ABSTRACT

A quadrature clock generator is disclosed. The quadrature clock generator may include a first injection-locked oscillator, a phase interpolator, and a second injection-locked oscillator. The first injection-locked oscillator may generate a first plurality clock signals from a first reference clock signal. The phase interpolator may generate a second reference clock signal from the first plurality of clock signals, and the second injection-locked oscillator may generate a second plurality of clock signals from the second reference clock signal. A first quadrature clock signal may be selected from the first plurality of clock signals and a second quadrature clock signal may be selected from the second plurality of reference clock signals.

19 Claims, 8 Drawing Sheets

(56) References Cited

OTHER PUBLICATIONS

Chen Shuai et al, "An 8Gb/s 0.75mW/Gb/s injection-locked retriever with constant jitter tracking bandwith and accurate quadrature clock generation in 40nm CMOS", 2014 21st IEEE International Conference on Electronics, Circuits and Systems (ICECS), IEEE, Dec. 7, 2014, pp. 9-12.
Kenichi Okada et al, "A 60-GHz 16QAM/8PSK/QPSK/BPSK Direct-Conversion Transceiver for IEEE802.15.3c", IEEE Journal of SOlid-State Circuits, IEEE, USA, vol. 46, No. 12, Dec. 1, 2011, pp. 2988-3004.
Chen, Stanley et al., "A 4-to16GHz Inverter-Based Injection-Locked Quadrature Clock Generator with Phase Interpolators for Multi-Standard I/Os in 7nm FinFET," IEEE International Solid-State Circuits Conference, Session 25, Clock Generation for High-Speed Links, 25.1, Feb. 14, 2018, Digest of Technical Papers, pp. 390-392.

* cited by examiner and the receive data processing block may be configured to receive data using a receive quadrature signal. The quadrature clock generator may be coupled to the transmit data processing block and to the receive data processing block, and may include a first injection-locked oscillator, a first select circuit, a phase interpolator, a second injection-locked oscillator, and a second select circuit. The first injection-locked oscillator may be configured to generate a plurality of first clock signals based at least in part on a first reference clock signal. The first select circuit may be configured to select one of the first clock signals as the transmit quadrature clock signal. The phase interpolator may be coupled to the first injection-locked oscillator and configured to generate a second reference clock signal based on a selected pair of the first clock signals. The second injection-locked oscillator may be configured to generate a plurality of second clock signals based at least in part on the second reference clock signal. The second select circuit may be configured to select one of the second clock signals as the receive quadrature clock signal.

LOW NOISE QUADRATURE SIGNAL GENERATION

TECHNICAL FIELD

Aspects of the present disclosure relate generally to oscillators, and more specifically to oscillators configured to generate quadrature clock signals.

BACKGROUND

Many wireless and wired communication systems employ Quadrature Amplitude Modulation (QAM) transceivers to transmit and receive data. Many QAM transceivers include a quadrature clock signal generator to provide the in-phase (I) and quadrature (Q) clock signals used for modulating or encoding transmit data and for demodulating or decoding receive data. Phase mismatch between the I and Q clock signals may introduce I/Q mismatch impairments in the transmitted and received signals, which in turn may cause signal degradation and data errors. Because I/Q phase mismatch may be related to clock frequencies, it is becoming more and more important to minimize I/Q phase mismatch as clock frequencies increase, for example, such as in multi-gigabit SERial/DESerial (SERDES) based communications.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

One innovative aspect of the subject matter described in this disclosure can be used to reduce phase mismatch between in-phase (I) and quadrature (Q) clock signals in quadrature clock generators. In some implementations, a quadrature clock generator may include a first injection-locked oscillator, a second injection-locked oscillator configured, a first select circuit, a second select circuit, and a phase interpolator. The first injection-locked oscillator may be configured to generate a plurality of first clock signals based at least in part on a first reference clock signal. The first select circuit may be coupled to the first injection-locked oscillator, and may be configured to select one of the first clock signals as a transmit quadrature clock signal. The phase interpolator may be coupled to the first injection-locked oscillator, and configured to generate a second reference clock signal based on the plurality of first clock signals. The second injection-locked oscillator may be configured to generate a plurality of second clock signals based at least in part on the second reference clock signal. The second select circuit coupled to the second injection-locked oscillator and configured to select one of the second clock signals as a receive quadrature clock signal.

Another innovative aspect of the subject matter described in this disclosure can be implemented in a programmable logic device. In some implementations, the programmable logic device may include a transmit data processing block, a receive data processing block, and a quadrature clock generator. The transmit data processing block may be configured to transmit data using a transmit quadrature signal, Another innovative aspect of the subject matter described in this disclosure can be implemented as a method for operating a quadrature clock generator. In some implementations, the method may include generating a plurality of first clock signals based at least in part on a first reference clock signal; selecting one of the plurality of first clock signals as a transmit quadrature clock signal; generating a second reference clock signal based at least in part on the plurality of first clock signals; generating a plurality of second clock signals based at least in part on the second reference clock signal; and selecting one of the plurality of second clock signals as a receive quadrature clock signal.

BRIEF DESCRIPTION OF THE DRAWINGS

The example implementations described herein are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Aspects of the present disclosure may be used to reduce or minimize I/Q mismatch and other phase errors that can degrade the signal integrity of wired and wireless communications. In some implementations, a quadrature clock generator is disclosed that utilizes two injection-locked oscillators and a single phase interpolator to generate a first set of in-phase (I) and quadrature (Q) clock signals and a second set of I and Q clock signals. The first and second sets of I and Q clock signals may be phase shifted relative to each other, and may be used to transmit and receive data. By using a single phase interpolator rather than multiple phase interpolators, aspects of the present disclosure may reduce phase mismatch compared to conventional quadrature clock generators.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

Figure 1:
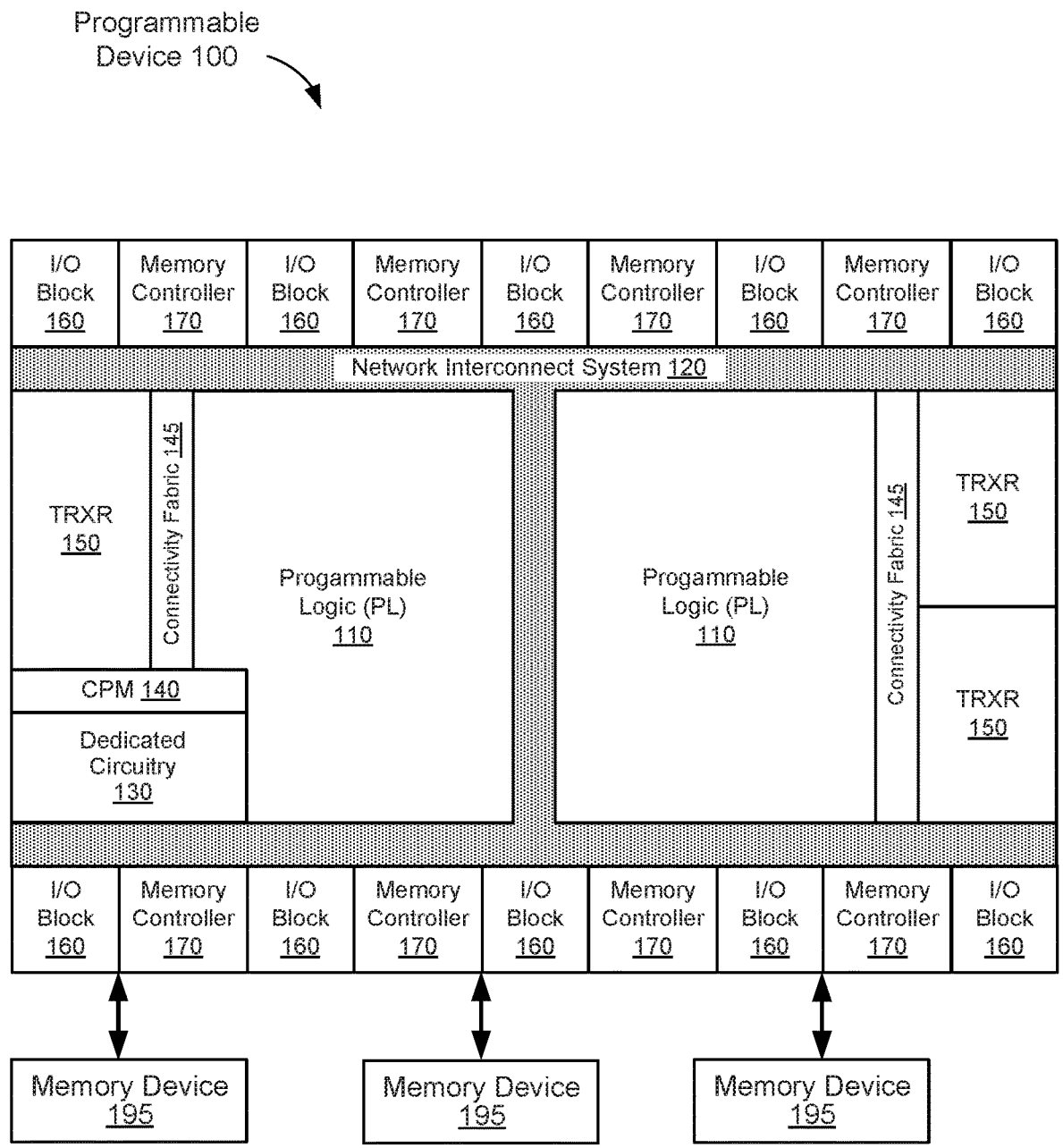
FIG. 1 shows a block diagram of an example programmable device within which aspects of the present disclosure may be implemented.

FIG. 1 shows a block diagram of an example programmable device 100 within which aspects of the present disclosure may be implemented. In some implementations, the device 100 may be formed on a single die. In other implementations, the device 100 may be distributed across a plurality of dice. In addition, or in the alternative, the device 100 may be implemented as a System-on-a-Chip (SoC) including a number of subsystems capable of interacting with one another. Thus, the programmable device 100 shown in FIG. 1 is an illustrative example of programmable devices within which aspects of the present disclosure may be implemented; other implementations with additional or fewer blocks or modules, in a similar or different arrangement, are possible.

The device 100 may include a number of subsystems such as, for example, programmable logic (PL) 110, a network-on-chip (NoC) interconnect system 120, dedicated circuitry 130, a CCIX and PCIe Module (CPM) 140, connectivity fabric 145, transceivers 150, input/output (I/O) blocks 160, and memory controllers 170. In one or more implementations, the device 100 may include other subsystems or components not shown in FIG. 1. Further, although not shown for simplicity, the device 100 may be coupled to a number of peripheral components (such as one or more high-performance memory devices 195) and/or other devices or chips (such as another programmable device).

The PL 110 includes circuitry that may be programmed to perform a number of different user-defined functions or operations. In some implementations, the PL 110 may include an array of programmable circuit blocks or tiles each including programmable interconnect circuitry and programmable logic circuitry. The programmable circuit blocks may include (but are not limited to) configurable logic blocks (CLBs), random access memory blocks (BRAM), digital signal processing blocks (DSPs), clock managers, delay lock loops (DLLs), and/or other logic or circuits that can be programmed or configured to implement a user-specified circuit design. In addition, or in the alternative, the PL 110 may include a number of input/output blocks (IOBs). In one or more implementations, the PL 110 may be implemented as an array of programmable fabric sub-regions (FSRs) that can be distributed across the programmable fabric. In some aspects, the FSRs may be implemented as repeatable tiles within the programmable fabric.

The programmable interconnect circuitry may include a plurality of interconnect wires of varying lengths interconnected by programmable interconnect points (PIPs). The interconnect wires may be configured to provide connectivity between components within a particular programmable tile, between components within different programmable tiles, and between components of a programmable tile and other subsystems or devices. The programmable interconnect circuitry and the programmable circuit blocks may be programmed or configured by loading configuration data into configuration registers that define how the programmable elements are configured and operate to implement a corresponding user-specified circuit design. In some aspects, the programmable interconnect circuitry within each of a number of the programmable circuit blocks may form part of a programmable interconnect fabric that provides block-level and/or device-level signal routing resources for the device 100.

Each CLB may include look-up tables (LUTs), flip-flops, combinational logic, and/or programmable interconnect circuitry that can be collectively programmed by the configuration data to perform various logic functions (such as addition and subtraction) on input signals of varying widths. The LUTs may be of any suitable size, and may include any suitable number of inputs and outputs. In some aspects, each CLB may include 32 LUTs and 64 flip-flops. Each of the CLBs may also include arithmetic carry logic and multiplexers that can be used to implement wider logic functions. In some implementations, the resources of the PL 110 may be implemented as repeatable tiles arranged in columns in the programmable device 100, and may be divided into a number of regions of a fixed height and width. For the example of FIG. 1, the PL 110 is depicted as occupying different regions of the device 100. In other implementations, the PL 110 may be implemented as a unified region of programmable fabric.

The NoC interconnect system 120, which may be fabricated as part of the device 100, provides a high-speed, high-bandwidth programmable signal routing network that may selectively interconnect the various resources, subsystems, circuits, and other components of the device 100. In some implementations, the NoC interconnect system 120 may extend in the horizontal and vertical directions across the programmable fabric (e.g., towards the edges) of the device 100, as shown in FIG. 1. In addition, or in the alternative, the NoC interconnect system 120 may extend in one or more diagonal directions across the programmable fabric. Further, although shown in the example of FIG. 1 as having a single columnar portion, in other implementations, the NoC interconnect system 120 may include a plurality of columnar portions extending vertically across the height of the programmable fabric. Thus, the particular layout, shape, size, orientation, and other physical characteristics of the example NoC interconnect system 120 are merely illustrative of the various implementations disclosed herein.

In some implementations, the NoC interconnect system 120 may employ a data packet protocol and memory-mapped addresses to route information between the various resources, subsystems, circuits, and other components of the device 100 as packetized data. The data packets may include source addresses, destination addresses, and protocol information that can be used by the NoC interconnect system 120 to route the data packets to their indicated destinations. In one or more implementations, the data packets may include Quality-of-Service (QoS) information that allows the transmission of data packets through the NoC interconnect system 120 to be prioritized, for example, based on assigned priorities, traffic types, and/or flow information. In such implementations, the NoC interconnect system 120 may include priority logic that can determine priority levels or traffic classes of received data packets, and use the determined priority levels or traffic classes when queuing the data packets for transmission.

Although not shown for simplicity, the NoC interconnect system 120 may also include a scheduler and arbitration logic. The scheduler may be used to schedule the transmission of data packets from a source address to a destination address using one or more physical and/or virtual channels of the NoC interconnect system 120. The arbitration logic may be used to arbitrate access to the NoC interconnect system 120, for example, to minimize collisions and other contention-related latencies. For implementations in which the device 100 is fabricated using stacked silicon interconnect (SSI) technology, the columnal portions of the NoC interconnect system 120 may provide signal connections between adjacent super logic regions (SLRs), for example, to allow configuration data to be routed between master and slave SLRs.

In some implementations, the NoC interconnect system 120 may include a plurality of nodes, ports, or other interfaces (not shown for simplicity) that provide selective connectivity between the NoC interconnect system 120 and the various resources, subsystems, circuits, and other components of the device 100. For example, the NoC interconnect system 120 may allow multiple subsystems of the device 100 to share access to on-chip memory (OCM) resources, processing resources, and/or I/O resources. By selectively interconnecting the various resources, subsystems, circuits, and other components of the device 100 that can demand and use large amounts of data, the NoC interconnect system 120 may alleviate signal routing burdens on local interconnect resources, thereby increasing device performance and allowing for greater configuration flexibility than other programmable devices. Moreover, by providing a high-performance signal routing network having higher data transmission rates and lower error rates than device-level and block-level programmable interconnects, the NoC interconnect system 120 may increase the processing power and data throughput of the device 100 (as compared to other programmable devices).

The dedicated circuitry 130 may include any suitable hard-wired circuits including (but not limited to) processors, serial transceivers, digital signal processors (DSPs), analog-to-digital converters (ADCs), digital-to-analog converters (DACs), device management resources, device monitoring resources, device testing management resources, and so on. In some implementations, the dedicated circuitry 130 may include a processing system (PS) and a platform management controller (PMC). In some implementations, the PS may include a number of processor cores, cache memory, and unidirectional and/or bidirectional interfaces configurable to couple directly to the I/O pins of the device 100. In some aspects, each processor core may include central processing units (CPU) or scalar processors that can be used for sequential data processing. The PMC may be used for booting and configuring the device 100 based on configuration data (such as a configuration bitstream) provided from external memory. The PMC may also be used to configure the PL 110 and to control various encryption, authentication, system monitoring, and debug capabilities of the device 100.

The CCIX and PCIe module (CPM) 140 may include a number of interfaces that provide connectivity between the device 100 and a number of peripheral components (such as external devices or chips). In some implementations, the CPM 140 may include a number of peripheral interconnect express (PCIe) interfaces and cache coherent interconnect for accelerators (CCIX) interfaces that provide connectivity to other devices or chips via the transceivers 150. In some aspects, the PCIe and CCIX interfaces may be implemented as part of the transceivers 150.

The programmable interconnect fabric (not shown for simplicity) may provide block-level and/or device-level signal routing resources that can selectively interconnect circuits and subsystems in nearby regions of the programmable fabric based on configuration data loaded into corresponding configuration registers. In some implementations, the programmable interconnect fabric may include a plurality of fabric sub-regions (FSRs) that can be implemented as repeatable tiles and distributed across the device 100. In some aspects, the FSRs may include portions of the programmable interconnect elements associated with the various programmable logic circuits (such as CLBs, DSPs, and BRAM) of the PL 110.

The transceivers 150 may provide signal connections with one or more other devices or chips (not shown for simplicity) connected to the device 100. The transceivers 150 may include a number of different data serializers and deserializers (SERDES) such as, for example, gigabit serial transceivers. In some implementations, the transceivers 150 may be implemented as a number of repeatable tiles positioned in various locations along the right and left sides of the device 100, as depicted in FIG. 1. In other implementations, the transceivers 150 may be positioned in other suitable locations of the device 100.

The I/O blocks 160 are coupled to the device's I/O pins (not shown for simplicity), and may provide I/O capabilities for the device 100. For example, the I/O blocks 160 may receive data from one or more other devices, and may drive the received data to a number of destinations in the device 100. The I/O blocks 160 may also receive data from a number of sources in the device 100, and may drive the received data to one or more other devices via the device's I/O pins. In some implementations, the I/O blocks 160 may be implemented as repeatable tiles. The device 100 may include any suitable number of I/O blocks 160, and therefore the example implementation depicted in FIG. 1 is merely illustrative.

The I/O blocks 160 may include any number of suitable I/O circuits or devices. In some implementations, the I/O blocks 160 may include extremely high-performance I/O (XPIO) circuits, high-density I/O (HDIO) circuits, and multiplexed I/O (MIO) circuits. The XPIO circuits may be optimized for high-performance communications such as providing a high-speed, low latency interface to the memory controllers 170. The HDIO circuits may provide a costeffective solution that supports lower speed and higher voltage I/O capabilities (as compared with the XPIO circuits). The MIO circuits may provide general-purpose I/O resources that can be accessed by various subsystems such as, for example, the PL 110, the dedicated circuitry 130, and the CPM 140.

In some implementations, a first row of I/O blocks 160 may be implemented as repeatable tiles positioned along a bottom edge of the device 100, and a second row of I/O blocks 160 may be implemented as repeatable tiles positioned along a top edge of the device 100. In some aspects, the repeatable tiles that implement the I/O blocks 160 may be different from one another. For example, some I/O blocks 160 may implement XPIO circuits, other I/O blocks 160 may implement HDIO circuits, and other I/O blocks 160 may implement MIO circuits.

The memory controllers 170 may be used to control access to various memory resources provided within and/or external to the device 100. The memory controllers 170 may include double data rate v4 (DDR4) memory controllers, double data rate v5 (DDR5) memory controllers, high bandwidth memory (HBM) controllers, and/or other suitable memory controllers. In one or more implementations, some or all of the memory controllers 170 may include a scheduler having transaction reordering capabilities that may improve memory access efficiency.

In some implementations, a first row of memory controllers 170 may be implemented as repeatable tiles positioned along the bottom edge of the device 100, and a second row of memory controllers 170 may be implemented as repeatable tiles positioned along the top edge of the device 100. In some aspects, the repeatable tiles that implement the memory controllers 170 may be different from one another. For example, a first number of the memory controllers 170 may implement DDR4 memory controllers, a second number of the memory controllers 170 may implement LPDDR4 memory controllers, and a third number of the memory controllers 170 may implement HBM controllers. The repeatable tiles that implement the I/O blocks 160 and memory controllers 170 may be alternately positioned or distributed relative to each other, for example, as depicted in the example of FIG. 1. The device 100 may include any number of the I/O blocks 160 and memory controllers 170, and therefore the numbers and positions of the I/O blocks 160 and memory controllers 170 depicted in FIG. 1 are merely illustrative.

Although not shown in FIG. 1 for simplicity, the device 100 may include a Boundary Logic Interface (BLI) that provides connectivity between the I/O blocks 160 and programmable interconnects provided within the PL 110. In some aspects, the BLI may allow large and complex external devices (such as HBM) to appear as much smaller blocks (such as a CLB) in the programmable fabric of the device 100. In some implementations, the BLI may be arranged in rows positioned at the top and bottom boundaries or edges of the programmable fabric. In this manner, the BLI may be used to route signals between columnar logic structures (such as a CLB column or a DSP column) and rows of I/O resources (such as the I/O blocks 160).

Figure 2:
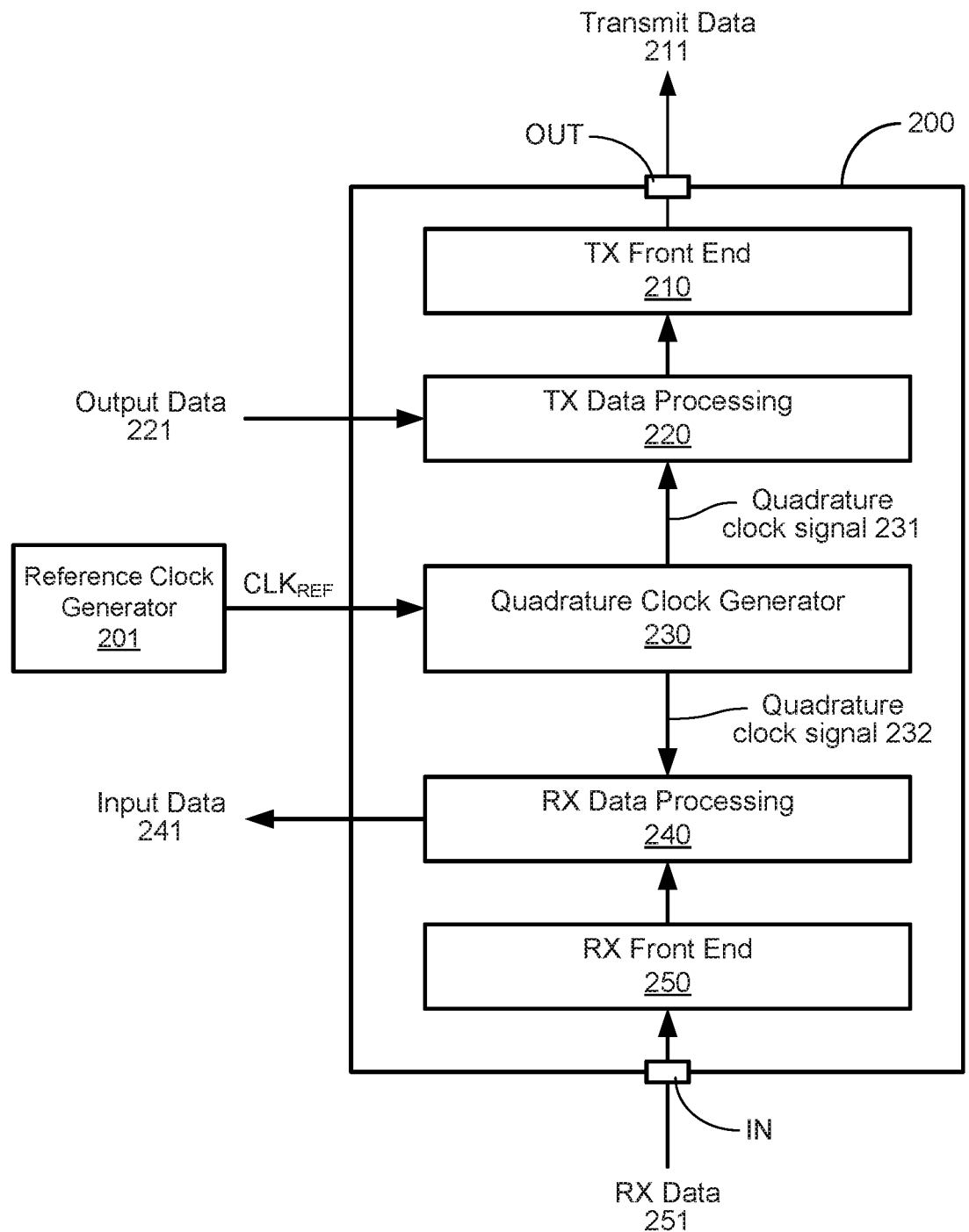
FIG. 2 shows a simplified block diagram of a transceiver, according to some implementations.

FIG. 2 shows a simplified block diagram of a transceiver 200, according to some implementations. The transceiver 200, which may be one example of one or more of the transceivers 150 of FIG. 1, is shown to include a transmit (TX) front end 210, a transmit data processing block 220, a quadrature clock generator 230, a receive (RX) data processing block 240, and a receive front end 250 coupled between an input terminal (IN) and an output terminal (OUT). In some implementations, the transceiver 200 may be a gigabit SERDES transceiver. In other implementations, the transceiver 200 may be of another suitable type or configuration.

The quadrature clock generator 230, which is coupled to the TX data processing block 220 and to the RX data processing block 240, includes an input terminal to receive a reference clock signal $CLK_{REF}$. For the example of FIG. 2, the reference clock signal $CLK_{REF}$ is generated by a reference clock generator 201, which may be any feasible reference clock source including (but not limited to) a crystal-based oscillator, a phase-locked loop, or the like. In other implementations, the reference clock signal $CLK_{REF}$ may be generated by another suitable circuit or oscillator.

The quadrature clock generator 230 may generate a first quadrature clock signal 231 and a second quadrature clock signal 232 based on $CLK_{REF}$. In some implementations, the first quadrature clock signal 231 may be used for transmitting data, and the second quadrature clock signal 232 may be used for receiving data. Although not shown in FIG. 2 for simplicity, the first quadrature clock signal 231 may include an in-phase (I) component and a quadrature (Q) component, and the second quadrature clock signal 232 may include an I component and a Q component. In some implementations, the I and Q components (which may also be referred to as I and Q clock signals) of the first quadrature clock signal 231 may be implemented as differential signals, and the I and Q components (which may also be referred to as the I and Q clock signals) of the second quadrature clock signal 232 may be implemented as differential signals.

In one or more implementations, the first quadrature clock signal 231 may be related in frequency to the second quadrature clock signal 232, but may be offset in phase relative to the second quadrature clock signal 232. For example, the first and second quadrature clock signals 231-232 may have the same frequency and offset in phase from one another by 45 degrees. For another example, the first and second quadrature clock signals 231-232 may have the same frequency and offset in phase from one another by 90 degrees (or some other suitable integer multiple of 45 degrees).

The transmit data processing block 220, which is coupled between the quadrature clock generator 230 and the transmit front end 210, may receive the first quadrature clock signal 231 generated by the quadrature clock generator 230. The transmit data processing block 220 may also receive output data 221 to be transmitted by the transceiver 200. The output data 221 may be provided by the PL 110, the dedicated circuitry 130, or any other feasible circuit, component, or subsystem of the programmable device 100 of FIG. 1. The transmit data processing block 220 may use the first quadrature clock signal 231 to encode and/or modulate the output data 221 for transmission. In some implementations, the transmit data processing block 220 may serialize the output data 221 based on the first quadrature clock signal 231.

The transmit front end 210 may process the encoded and/or modulated output data provided by the transmit data processing block 220, and may provide the processed output data as transmit data 211 to a wired or wireless communication medium. The transmit front end 210 may include any number of circuits or components suitable for preparing the processed output data for transmissions as transmit data 211. For example, in some aspects, the transmit front end 210 may include amplifiers, mixers, filters, and other components configured to increase signal integrity while minimizing noise, distortion, and timing errors.

The receive front end 250 may receive RX data 251 from one or more other devices or circuits, either via a wireless medium or a wired connection, via the input terminal IN. In some implementations, the receive front end 250 may include amplifiers, mixers, filters, and any other circuit or component suitable for maximizing data reception rates while minimizing data loss, noise, and distortion. The receive front end 250 may provide the RX data 251 to the receive data processing block 240.

The receive data processing block 240, which is also coupled to the quadrature clock generator 230, may use the second quadrature clock signal 232 to decode and/or demodulate the RX data 251 to generate input data 241. The input data 241 may be provided (or routed) to the PL 110, the dedicated circuitry 130, or any other feasible circuit, component, or subsystem of the programmable device 100 of FIG. 1. In some implementations, the receive data processing block 240 may deserialize the RX data 251 based on the second quadrature clock signal 232.

Figure 3:
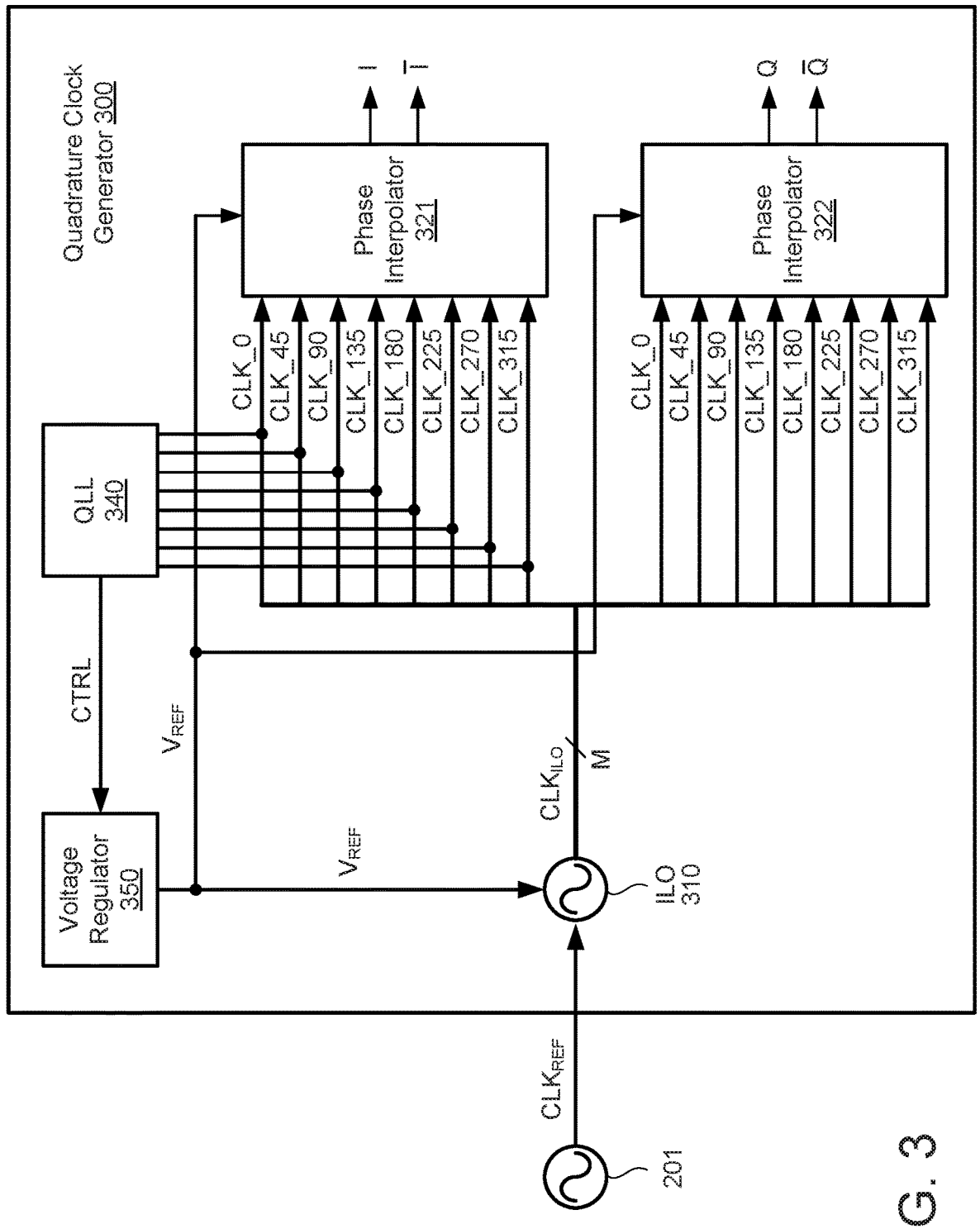
FIG. 3 shows a block diagram of an example quadrature clock generator, according to some implementations.

FIG. 3 shows a block diagram of an example quadrature clock generator 300, according to some implementations. The quadrature clock generator 300 may include an injection-locked oscillator (ILO) 310, a first phase interpolator 321, a second phase interpolator 322, a quadrature-locked loop (QLL) 340, and a voltage regulator 350. In some aspects, the quadrature clock generator 300 may be one example of the quadrature clock generator 230 of FIG. 2.

The ILO 310, which includes a first input coupled to the reference clock generator 201, a second input coupled to the voltage regulator 350, and an output coupled to the first and second phase interpolators 321-322, may be any suitable ILO that can generate a plurality of clock signals having the same frequency as the reference clock signal $CLK_{REF}$ yet offset in phase relative to each other. In some implementations, the ILO 310 may be configured as a differential oscillator, and the reference clock generator 201 may provide $CLK_{REF}$ as a differential clock signal.

The ILO 310 may generate a number M of clock signals $CLK_{ILO}$ that are frequency-locked to $CLK_{REF}$, where M is an integer greater than one. The clock signals $CLK_{ILO}$, which may also be referred to as clock phases, may be equally spaced or offset in phase from one each other, for example, such that each of the clock signals $CLK_{ILO}$ has a unique phase that is an integer multiple of a reference phase offset. For example, in the implementation of FIG. 3, the ILO 310 generates M=eight clock signals $CLK_{ILO}$ that are offset in phase from each other by forty-five degrees, where a first clock signal CLK_0 has no phase offset, a second clock signal CLK_45 has a phase offset of 45 degrees relative to CLK_0, a third clock signal CLK_90 has a phase offset of 90 degrees relative to CLK_0, a fourth clock signal CLK_135 has a phase offset of 135 degrees relative to CLK_0, a fifth clock signal CLK_180 has a phase offset of 180 degrees relative to CLK_0, a sixth clock signal CLK_225 has a phase offset of 225 degrees relative to CLK_0, a seventh clock signal CLK_270 has a phase offset of 270 degrees relative to CLK_0, and an eighth clock signal CLK_315 has a phase offset of 315 degrees relative to CLK_0.

The first phase interpolator 321 and the second phase interpolator 322 may be implemented using complementary metal oxide silicon (CMOS) technology, current mode logic (CML), or any other feasible technology. The first phase interpolator 321 may use a first set of the M clock signals $CLK_{ILO}$ provided by the ILO 310 to generate one or more in-phase (I) output clock signals, and the second phase interpolator 322 may use a second set of the M clock signals $CLK_{ILO}$ provided by the ILO 310 to generate one or more quadrature (Q) output clock signals. In the example of FIG. 3, the first phase interpolator 321 may generate a differential in-phase (I) output clock signal represented as I and $\bar{I}$ signals, where $\bar{I}$ is the logical complement of I. Similarly, the second phase interpolator 322 may generate a differential quadrature (Q) output clock signal represented as Q and $\bar{Q}$ signals, where $\bar{Q}$ is the logical complement of Q. In other instances, the first and second phase interpolators 321-322 may generate single-ended I and Q clock signals, respectively.

In some implementations, the first phase interpolator 321 may interpolate between a pair of adjacent clock signals of the first set (or the second set) of clock signals $CLK_{ILO}$ to generate the in-phase output clock signals, for example, such that the I and $\bar{I}$ signals may have any desired phase. Similarly, the second phase interpolator 322 may interpolate between a pair of adjacent clock signals of the second set (or the first set) of clock signals $CLK_{ILO}$ to generate the quadrature output clock signal, for example, such that the Q and $\bar{Q}$ signals may have any desired phase.

The QLL 340 includes a number of inputs coupled to one or more outputs of the ILO 310, and includes an output coupled to a control terminal of the voltage regulator 350. In some implementations, the QLL 340 may receive the M clock signals $CLK_{ILO}$ (such as clock signals CLK_0, CLK_45, CLK_90, CLK_135, CLK_180, CLK_225, CLK_270, and CLK_315), and may be configured to generate a control signal (CTRL) based on one or more relationships between the M clock signals $CLK_{ILO}$. The CTRL signal is provided to the control input of the voltage regulator 350, which in turn may generate a reference voltage $V_{REF}$ based at least in part on the CTRL signal.

The voltage regulator 350 may provide the reference voltage $V_{REF}$ to control terminals of the ILO 310, the first phase interpolator 321, and the second phase interpolator 322. The reference voltage $V_{REF}$ may be used to control, adjust, or modify one or more operating characteristics of the ILO 310, the first phase interpolator 321, and the second phase interpolator 322.

In some implementations, the QLL 340 may also receive one or more signals (not shown for simplicity) provided by the receive data processing block 240 of FIG. 2. These one or more signals may embody or indicate various characteristics of incoming RX data, and the QLL 340 may be configured to generate the control signal CTRL based at least in part on these one or more signals. For example, in some aspects, these one or more signals may adjust the reference voltage $V_{REF}$ in a manner that causes the first phase interpolator 321 to maintain a certain relationship between the in-phase output clock signal and the RX data, and/or that causes the second phase interpolator 322 to maintain a certain relationship between the quadrature output clock signal and the RX data.

Mismatches between circuit elements (such as mixers and filters) within the first and second phase interpolators 321-322 may cause timing mismatch between the in-phase output clock signal and the quadrature clock signal. In accordance with other aspects of the present disclosure, timing mismatch between the I and Q output clock signals may be avoided by using single phase interpolator (rather than the two phase interpolators 321-322 of FIG. 3).

Figure 4A:
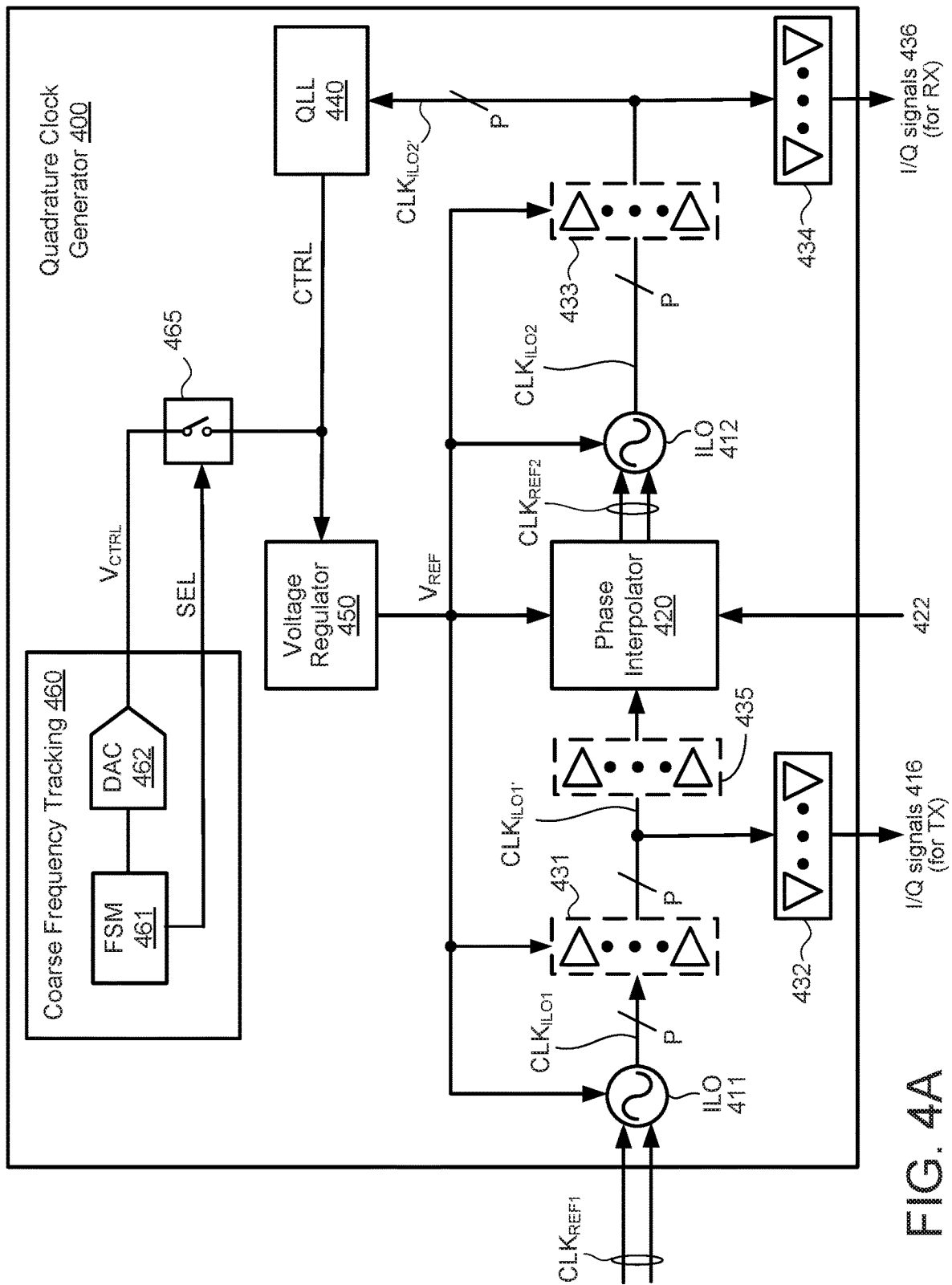
FIG. 4A shows a block diagram of another example quadrature clock generator, according to some implementations.

FIG. 4A shows a block diagram of another example quadrature clock generator 400, according to some implementations. The quadrature clock generator 400, which may be an example of the quadrature clock generator 230 of FIG. 2, is shown to include a first ILO 411, a second ILO 412, a phase interpolator 420, a number of buffers 431, 433, and 435, a number of select circuits 432 and 434, a quadrature-locked loop (QLL) 440, a voltage regulator 450, a coarse frequency tracking circuit 460, and a switch 465.

The first ILO 411, which includes a first input coupled to receive a first reference voltage $V_{REF1}$, a second input coupled to the voltage regulator 450, and an output coupled to the first buffer 431, may be any suitable ILO that can generate a plurality of clock signals having the same frequency as the reference clock signal $CLK_{REF}$ yet offset in phase relative to each other. The first reference clock signal $CLK_{REF}$ may be generated by the reference clock generator 201 (not shown in FIG. 4 for simplicity), or alternatively by another suitable clock generation circuit. In some implementations, the first ILO 411 may be configured as a differential oscillator, and the reference clock generator 201 may provide $CLK_{REF1}$ as a differential clock signal.

The first ILO 411 may generate a number P of first clock signals $CLK_{ILO1}$ that are frequency-locked to $CLK_{REF1}$, where P is an integer greater than one. The first clock signals $CLK_{ILO1}$, which may also be referred to as clock phases, may be equally spaced or offset in phase from one each other, for example, such that each of the first clock signals $CLK_{ILO1}$ has a unique phase that is an integer multiple of a reference phase offset. For example, in some implementations, the first ILO 411 may generate P=8 first clock signals $CLK_{ILO1}$ that are offset in phase from each other by forty-five degrees, where a first clock signal CLK_0 has no phase offset, a second clock signal CLK_45 has a phase offset of 45 degrees relative to CLK_0, a third clock signal CLK_90 has a phase offset of 90 degrees relative to CLK_0, a fourth clock signal CLK_135 has a phase offset of 135 degrees relative to CLK_0, a fifth clock signal CLK_180 has a phase offset of 180 degrees relative to CLK_0, a sixth clock signal CLK_225 has a phase offset of 225 degrees relative to CLK_0, a seventh clock signal CLK_270 has a phase offset of 270 degrees relative to CLK_0, and an eighth clock signal CLK_315 has a phase offset of 315 degrees relative to CLK_0.

In some implementations, the first clock signals $CLK_{ILO1}$ generated by the first ILO 411 may be buffered by the buffer 431 to generate buffered first clock signals $CLK_{ILO1}$, which may be provided to the phase interpolator 420 and to the first select circuit 432. In other implementations, the optional buffer 431 (as indicated by the dashed lines) may be omitted, and the first clock signals $CLK_{ILO1}$ may be provided to the phase interpolator 420 and to the first select circuit 432. In some implementations, the optional buffer 435 (as indicated by the dashed lines) may buffer the buffered first clock signals $CLK_{ILO1}$, for the phase interpolator 420. In other implementations, the optional buffer 435 may be omitted.

The phase interpolator 420 may use the first clock signals $CLK_{ILO1}$ provided by the first ILO 411 to generate a second reference clock signal $CLK_{REF2}$. In the example of FIG. 4, the phase interpolator 420 may generate the second reference clock signal $CLK_{REF2}$ as a differential signal. In some implementations, the phase interpolator 420 may interpolate between a pair of adjacent clock signals of the plurality of first clock signals $CLK_{ILO1}$ to generate the second reference clock signal $CLK_{REF2}$. In this manner, the phase interpolator 420 may generate the second reference clock signal $CLK_{REF2}$ with an arbitrary phase relationship to the first clock signals $CLK_{ILO1}$. In addition, or in the alternative, the phase interpolator 420 may receive a signal 422 from an associated receive circuit (such as a clock data recovery circuit and/or a receive data processing block), and may use the signal 422 to control or adjust the interpolation.

The phase interpolator 420 may be implemented using complementary metal oxide silicon (CMOS) technology, current mode logic (CML), or any other feasible technology. In some implementations, the phase interpolator 420 may be an example of the first phase interpolator 321 or the second phase interpolator 322 of FIG. 3. Thus, although not shown for simplicity, each of the number P of first clock signals $CLK_{ILO1}$ may be provided to corresponding inputs of the phase interpolator 420, and the phase interpolator 420 may generate the second reference clock signal $CLK_{REF2}$ based on relationships between the number P of first clock signals $CLK_{ILO1}$.

The first select circuit 432 may be configured to select two (or a pair) of the first clock signals $CLK_{ILO1}$ to provide as I/Q output clock signals 416. In some implementations, the first select circuit 432 may select any suitable pair of the first clock signals $CLK_{ILO1}$ to provide as I/Q TX output clock signals 416. A transmit circuit, such as the transmit data processing block 220 of FIG. 2, may use the I/Q output clock signals 416 to encode or modulate data for transmission.

The second ILO 412, which includes first inputs coupled to the phase interpolator 420, a second input to receive $V_{REF}$ from the voltage regulator 450, and an output coupled to an optional buffer 433 (as indicated by the dashed lines), may be any suitable ILO that can generate a plurality of clock signals having the same frequency as the second reference clock signal $CLK_{REF2}$ yet offset in phase relative to each other. The second ILO 412 may generate a number P of second clock signals $CLK_{ILO2}$ that are frequency-locked to $CLK_{REF2}$, where P is an integer greater than one. The second clock signals $CLK_{ILO2}$, which may also be referred to as clock phases, may be equally spaced or offset in phase from one each other, for example, such that each of the second clock signals $CLK_{ILO2}$ has a unique phase that is an integer multiple of a reference phase offset.

In some implementations, the second clock signals $CLK_{ILO2}$ may also be equally spaced or offset in phase from one each other, for example, such that each of the second clock signals $CLK_{ILO2}$ has a unique phase that is an integer multiple of a reference phase offset. For example, in some implementations, the second ILO 412 may generate P=8 second clock signals $CLK_{ILO2}$ that are offset in phase from each other by forty-five degrees, where a first clock signal CLK_0 has no phase offset, a second clock signal CLK_45 has a phase offset of 45 degrees relative to CLK_0, a third clock signal CLK_90 has a phase offset of 90 degrees relative to CLK_0, a fourth clock signal CLK_135 has a phase offset of 135 degrees relative to CLK_0, a fifth clock signal CLK_180 has a phase offset of 180 degrees relative to CLK_0, a sixth clock signal CLK_225 has a phase offset of 225 degrees relative to CLK_0, a seventh clock signal CLK_270 has a phase offset of 270 degrees relative to CLK_0, and an eighth clock signal CLK_315 has a phase offset of 315 degrees relative to CLK_0. In some aspects, the second clock signals $CLK_{ILO2}$ may be provided to the optional buffer 433 to generate a plurality of buffered second clock signals $CLK_{ILO2'}$.

The second select circuit 434 may be configured to select two (or a pair) of the second clock signals $CLK_{ILO2}$ to provide as I/Q RX output clock signals 436. In some implementations, the second select circuit 434 may select any suitable pair of the second clock signals $CLK_{ILO2}$ to provide as the I/Q RX output clock signals 436. A receive circuit, such as the receive data processing block 240 of FIG. 2, may use the I/Q RX output clock signals 436 to decode or demodulate data received by the transceiver 400.

The QLL 440 includes a number of inputs coupled to one or more outputs of the second ILO 412 (via the optional buffer 433), and includes an output coupled to a control terminal of the voltage regulator 450. In some implementations, the QLL 440 may receive the number P of second clock signals $CLK_{ILO2}$ (such as clock signals CLK_0, CLK_45, CLK_90, CLK_135, CLK_180, CLK_225, CLK_270, and CLK_315), and may be configured to generate a control signal (CTRL) based on one or more relationships between the second clock signals $CLK_{ILO2}$. The CTRL signal is provided to the control input of the voltage regulator 450, which in turn may generate a reference voltage $V_{REF}$ based at least in part on the CTRL signal.

The voltage regulator 450 may provide the reference voltage $V_{REF}$ to control terminals of the first ILO 411, the second ILO 412, the phase interpolator 420, and the optional buffers 431 and 433. The reference voltage $V_{REF}$ may be used to control, adjust, or modify one or more operating characteristics of the first ILO 411, the second ILO 412, and the phase interpolator 420 (as well as the optional buffers 431 and 433). In some implementations, the QLL 440 may control or adjust the value of the control signal (CTRL) based on the relative phases of the second clock signals $CLK_{ILO2}$. The voltage regulator 450 may adjust the value of $V_{REF}$ based at least in part on the control signal (CTRL), thereby allowing the QLL 440 to essentially control various operations of the first ILO 411, the second ILO 412, and the phase interpolator 420. In some implementations, the voltage regulator 450 may also control operation of the optional buffers 431 and 433.

The coarse frequency tracking circuit 460, which may include a finite state machine (FSM) 461 and a digital-to-analog converter (DAC) 462, may be used to control initial start-operations of at least the first ILO 411 and the second ILO 412. In some implementations, the coarse frequency tracking circuit 460 may generate a control voltage $V_{CTRL}$ in response to detecting a start-up condition, and use the control voltage $V_{CTRL}$ to temporarily disable the CTRL signal generated by the QLL 440 during the start-up operation. More specifically, upon detecting a start-up condition, the FSM 461 may assert a select signal that causes the switch 465 to close (such as in a conductive state), and may output a digital voltage or code that causes the DAC 462 to drive $V_{CTRL}$ to a level that disables the CTRL signal via the switch 465, for example, such that the voltage regulator 450 can control oscillation frequencies of at least the first ILO 411 and the second ILO 512 before quadrature lock is established during start-up conditions. At other times, the FSM 461 may de-assert the SELL signal to open the switch 465 (such as to maintain the switch 465 in a non-conductive state).

In some implementations, an I/Q mismatch may exist between the I/Q TX clock signals 416 and/or may exist between the I/Q RX clock signals 436. Mismatches between the I/Q TX clock signals 416 and mismatches between the I/Q RX clock signals 436 may be caused by the QLL 440 monitoring the second clock signals $CLK_{ILO2}$ while not monitoring the first clock signals $CLK_{ILO1}$.

Figure 4B:
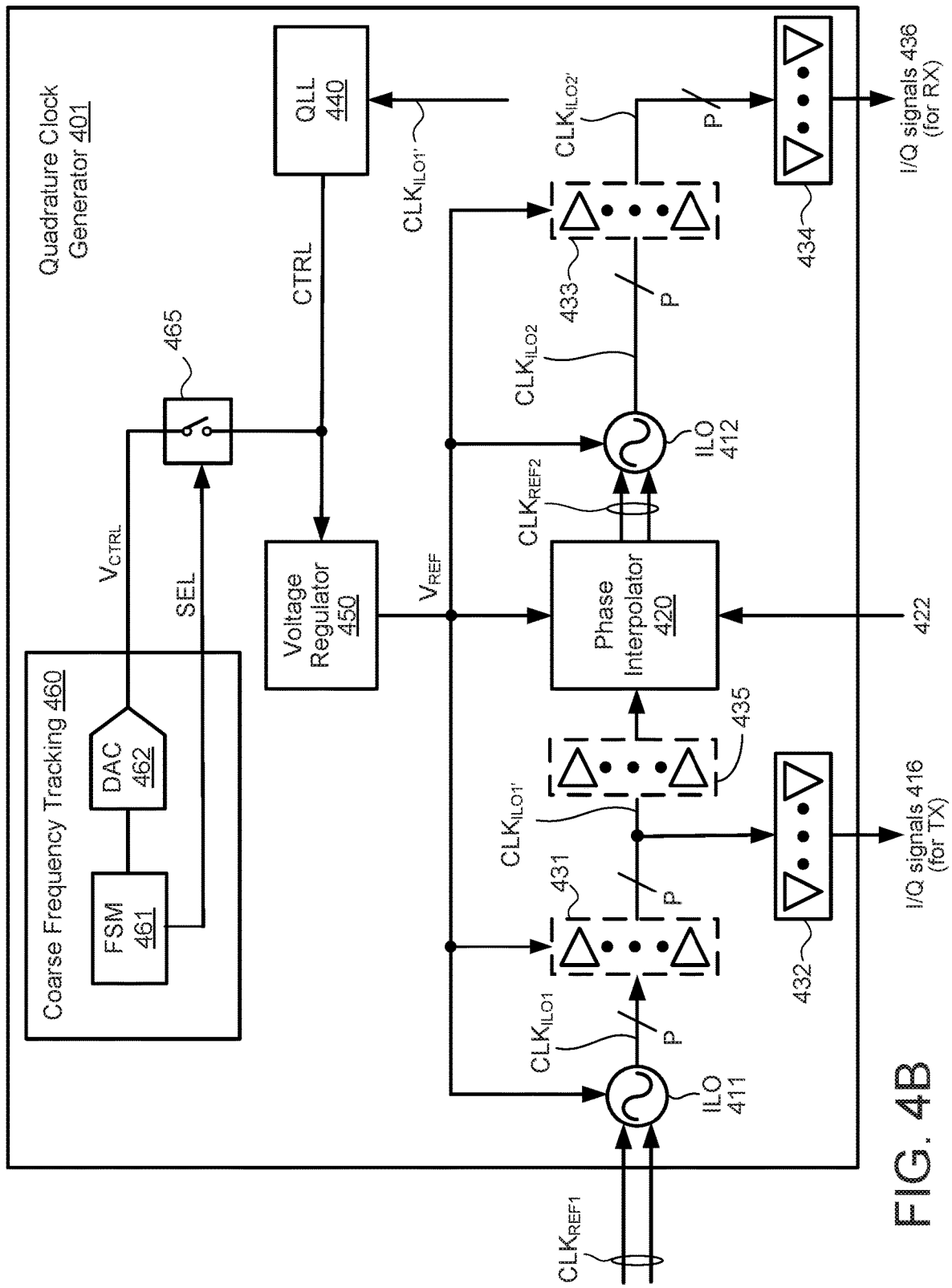
FIG. 4B shows a block diagram of another example quadrature clock generator, according to other implementations.

FIG. 4B shows a block diagram of another example quadrature clock generator 401, according to other implementations. The quadrature clock generator 401 is similar in many aspects to the quadrature clock generator 400 of FIG. 4A, except that the QLL 440 receives the buffered first clock signals $CLK_{ILO1'}$ as input signals, for example, rather than the buffered second clock signals $CLK_{ILO2'}$.

Figure 5A:
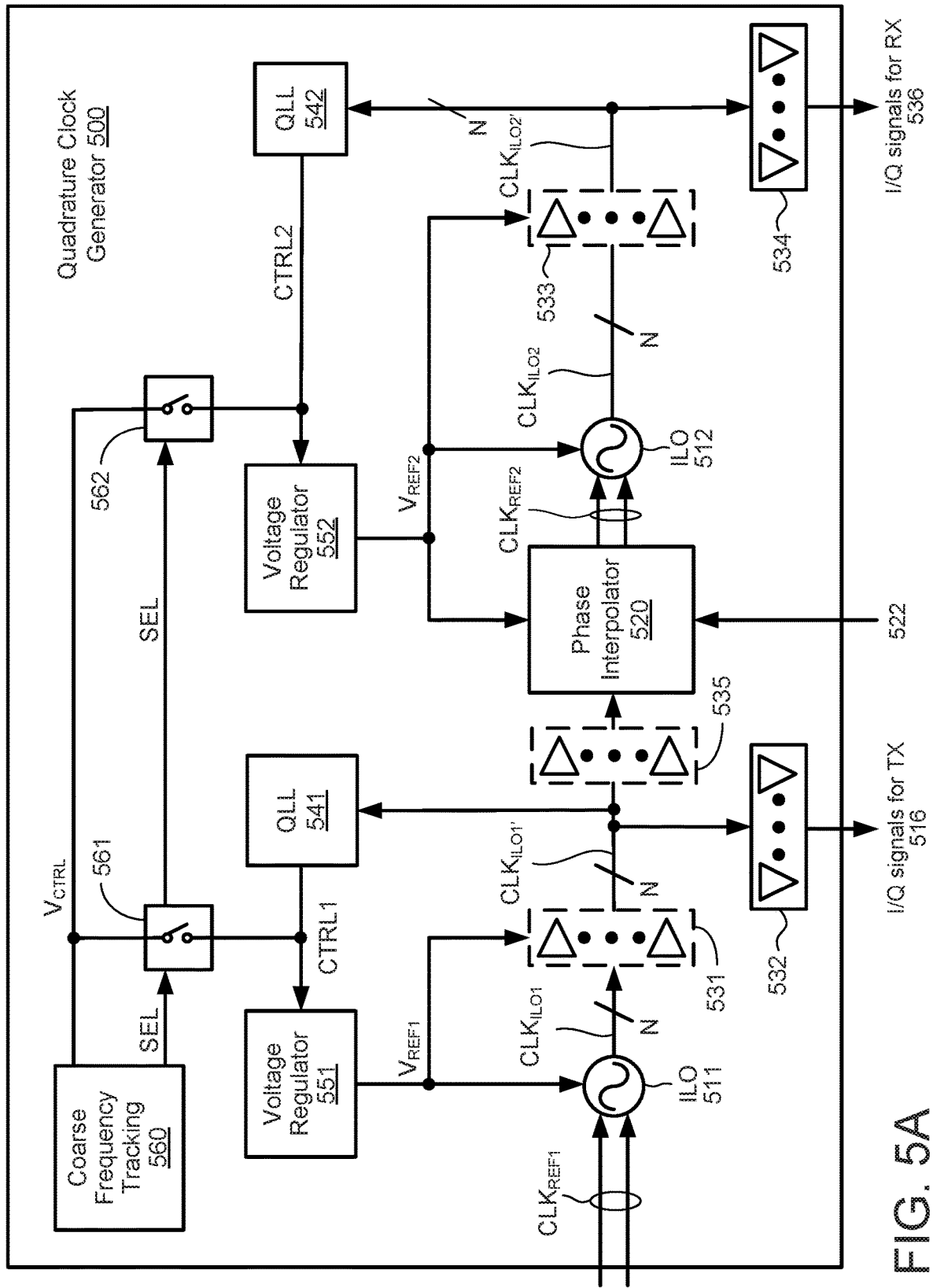
FIG. 5A shows a block diagram of another example quadrature clock generator, according to some implementations.

FIG. 5A shows a block diagram of another example quadrature clock generator 500, according to some implementations. The quadrature clock generator 500 may include a first ILO 511, a second ILO 512, a phase interpolator 520, a first optional buffer 531, a first select circuit 532, a second optional buffer 533, a second select circuit 534, a first QLL 541, a second QLL 542, a first voltage regulator 551, a second voltage regulator 552, a coarse frequency tracking circuit 560, a first switch 561, and a second switch 562. As discussed in more detail below, the quadrature clock generator 500 may use the first QLL 541 to control the I/Q TX clock signals 516 used by a transmit data processing block, and may use the second QLL 542 to control the I/Q RX clock signals 536 used by a receive data processing block.

The first ILO 511, which includes first inputs coupled to receive a first reference clock signal $CLK_{REF1}$, a second input to receive a first reference voltage $V_{REF1}$ generated by the first voltage regulator 551, and an output coupled to the first buffer 531, may be any suitable ILO that can generate a plurality of clock signals having the same frequency as the first reference clock signal $CLK_{REF1}$ yet offset in phase relative to each other. The first reference clock signal $CLK_{REF1}$ may be generated by the reference clock generator 201 (not shown in FIG. 5 for simplicity), or alternatively by another suitable clock generation circuit. In some implementations, the first ILO 511 may be configured as a differential oscillator, and the reference clock generator 201 may provide $CLK_{REF1}$ as a differential clock signal.

The first ILO 511 may generate a number N of first clock signals $CLK_{ILO1}$ that are frequency-locked to $CLK_{REF1}$, where N is an integer greater than one. The first clock signals $CLK_{ILO1}$, which may also be referred to as clock phases, may be equally spaced or offset in phase from one each other, for example, such that each of the first clock signals $CLK_{ILO1}$ has a unique phase that is an integer multiple of a reference phase offset. For example, in some implementations, the first ILO 511 may generate N=8 first clock signals $CLK_{ILO1}$ that are offset in phase from each other by forty-five degrees, where a first clock signal CLK_0 has no phase offset, a second clock signal CLK_45 has a phase offset of 45 degrees relative to CLK_0, a third clock signal CLK_90 has a phase offset of 90 degrees relative to CLK_0, a fourth clock signal CLK_135 has a phase offset of 135 degrees relative to CLK_0, a fifth clock signal CLK_180 has a phase offset of 180 degrees relative to CLK_0, a sixth clock signal CLK_225 has a phase offset of 225 degrees relative to CLK_0, a seventh clock signal CLK_270 has a phase offset of 270 degrees relative to CLK_0, and an eighth clock signal CLK_315 has a phase offset of 315 degrees relative to CLK_0.

In some implementations, the first clock signals $CLK_{ILO1}$ generated by the first ILO 511 may be buffered by the buffer 531 to generate buffered first clock signals $CLK_{ILO1'}$, which may be provided to the phase interpolator 520, the first select circuit 532, and the first QLL 541. In other implementations, the optional buffer 531 (as indicated by the dashed lines) may be omitted, and the first clock signals $CLK_{ILO1}$ may be provided to the phase interpolator 520, the first select circuit 532, and the first QLL 541. In some implementations, the optional buffer 535 (as indicated by the dashed lines) may buffer the buffered first clock signals $CLK_{ILO1'}$ for the phase interpolator 520. In other implementations, the optional buffer 535 may be omitted.

The first QLL 541 includes a number of inputs coupled to one or more outputs of the first ILO 511 (via the optional buffer 531), and includes an output coupled to a control terminal of the first voltage regulator 551. In some implementations, the first QLL 541 may receive the number N of first clock signals $CLK_{ILO1}$ (such as clock signals CLK_0, CLK_45, CLK_90, CLK_135, CLK_180, CLK_225, CLK_270, and CLK_315), and may be configured to generate a first control signal (CTRL1) based on one or more relationships between the first clock signals $CLK_{ILO1}$. The CTRL1 signal is provided to the control input of the first voltage regulator 551, which in turn may generate $V_{REF1}$ based at least in part on the CTRL1 signal.

The first voltage regulator 551 may provide $V_{REF1}$ to control terminals of the first ILO 511 and the optional buffer 531, for example, to control, adjust, or modify one or more operating characteristics of the first ILO 511 and the optional buffer 531. In some implementations, the first QLL 541 may control or adjust the value of the CTRL1 signal based on the relative phases of the first clock signals $CLK_{ILO1}$. The first voltage regulator 551 may adjust the value of $V_{REF1}$ based at least in part on the CTRL1 signal, thereby allowing the first QLL 541 to control various operations of the first ILO 511.

The phase interpolator 520 may use the first clock signals $CLK_{ILO1}$ provided by the first ILO 511 to generate a second reference clock signal $CLK_{REF2}$. In the example of FIG. 5, the phase interpolator 520 may generate the second reference clock signal $CLK_{REF2}$ as a differential signal. In some implementations, the phase interpolator 520 may interpolate between a pair of adjacent clock signals of the plurality of first clock signals $CLK_{ILO1}$ to generate the second reference clock signal $CLK_{REF2}$. In this manner, the phase interpolator 520 may generate the second reference clock signal $CLK_{REF2}$ with an arbitrary phase relationship to the first clock signals $CLK_{ILO1}$. In addition, or in the alternative, the phase interpolator 520 may receive a signal 522 from an associated receive circuit (such as a clock data recovery circuit and/or a receive data processing block), and may use the signal 522 to control or adjust the interpolation.

The phase interpolator 520 may be implemented using complementary metal oxide silicon (CMOS) technology, current mode logic (CML), or any other feasible technology. In some implementations, the phase interpolator 520 may be an example of the first phase interpolator 321 or the second phase interpolator 322 of FIG. 3. Thus, although not shown for simplicity, each of the number N of first clock signals $CLK_{ILO1}$ may be provided to corresponding inputs of the phase interpolator 520, and the phase interpolator 520 may generate the second reference clock signal $CLK_{REF2}$ based on relationships between the number N of first clock signals $CLK_{ILO1}$.

The first select circuit 532 may be configured to select two (or a pair) of the first clock signals $CLK_{ILO1}$ to provide as I/Q TX output clock signals 516. In some implementations, the first select circuit 532 may select any suitable pair of the first clock signals $CLK_{ILO1}$ to provide as the I/Q TX output clock signals 516. A transmit circuit, such as the transmit data processing block 220 of FIG. 2, may use the I/Q TX output clock signals 516 to encode or modulate data for transmission.

The second ILO 512, which includes first inputs to receive the second reference clock signal $CLK_{REF2}$ from the phase interpolator 520, a second input to receive a second reference voltage $V_{REF2}$ generated by the second voltage regulator 552, and an output coupled to an optional buffer 533 (as indicated by the dashed lines), may be any suitable ILO that can generate a plurality of clock signals having the same frequency as the second reference clock signal $CLK_{REF2}$ yet offset in phase relative to each other.

In some implementations, the second clock signals $CLK_{ILO2}$ may also be equally spaced or offset in phase from one each other, for example, such that each of the second clock signals $CLK_{ILO2}$ has a unique phase that is an integer multiple of a reference phase offset. For example, in some implementations, the second ILO 512 may generate N=8 second clock signals $CLK_{ILO2}$ that are offset in phase from each other by forty-five degrees, where a first clock signal CLK_0 has no phase offset, a second clock signal CLK_45 has a phase offset of 45 degrees relative to CLK_0, a third clock signal CLK_90 has a phase offset of 90 degrees relative to CLK_0, a fourth clock signal CLK_135 has a phase offset of 135 degrees relative to CLK_0, a fifth clock signal CLK_180 has a phase offset of 180 degrees relative to CLK_0, a sixth clock signal CLK_225 has a phase offset of 225 degrees relative to CLK_0, a seventh clock signal CLK_270 has a phase offset of 270 degrees relative to CLK_0, and an eighth clock signal CLK_315 has a phase offset of 315 degrees relative to CLK_0. In some aspects, the second clock signals $CLK_{ILO2}$ may be provided to the optional buffer 533 to generate a plurality of buffered second clock signals $CLK_{ILO2'}$.

The second select circuit 534 may be configured to select two (or a pair) of the second clock signals $CLK_{ILO2}$ to provide as I/Q RX output clock signals 536. In some implementations, the second select circuit 534 may select any suitable pair of the second clock signals $CLK_{ILO2}$ to provide as the I/Q RX output clock signals 536. A receive circuit, such as the receive data processing block 240 of FIG. 2, may use the I/Q RX output clock signals 536 to decode or demodulate data received by the transceiver 500.

The second QLL 542 includes a number of inputs coupled to one or more outputs of the second ILO 512 (via the optional buffer 533), and includes an output coupled to a control terminal of the second voltage regulator 552. In some implementations, the second QLL 452 may receive the number N of second clock signals $CLK_{ILO2}$ (such as clock signals CLK_0, CLK_45, CLK_90, CLK_135, CLK_180, CLK_225, CLK_270, and CLK_315), and may be configured to generate a second control signal (CTRL2) based on one or more relationships between the second clock signals $CLK_{ILO2}$. The CTRL2 signal is provided to the control input of the second voltage regulator 552, which in turn may generate and/or adjust a value of $V_{REF2}$ based at least in part on the CTRL2 signal.

The second voltage regulator 552 may provide $V_{REF2}$ to control terminals of the phase interpolator 520, the second ILO 512, and the optional buffer 533, for example, to control, adjust, or modify one or more operating characteristics of the phase interpolator 520 and the second ILO 512. In some implementations, the second QLL 542 may control or adjust the value of the CTRL2 signal based on the relative phases of the second clock signals $CLK_{ILO2}$. The second voltage regulator 552 may adjust the value of $V_{REF2}$ based at least in part on the CTRL2 signal, thereby allowing the second QLL 542 to control various operations of the phase interpolator 520 and the second ILO 512.

The coarse frequency tracking circuit 560, which may be one implementation of the coarse frequency tracking circuit 460 of FIG. 4, may be used to control initial start-operations of at least the first ILO 511 and the second ILO 512. In some implementations, the coarse frequency tracking circuit 560 may generate a control voltage $V_{CTRL}$ and assert the select (SEL) signal in response to detecting a start-up condition, and use the control voltage $V_{CTRL}$ and the SEL signal to temporarily disable the CTRL1 signal via the first switch 561 and/or to temporarily disable the CTRL2 signal via the second switch 562. More specifically, upon detecting the start-up condition, the coarse frequency tracking circuit 560 may assert the SEL signal to close or turn on switches 561-562, and may drive $V_{CTRL}$ to a level that disables the CTRL1 signal via switch 561 and/or that disables the CTRL1 signal via switch 562. In this manner, the coarse frequency tracking circuit 560 may allow the first voltage regulator 551 to control oscillation frequencies of the first ILO 511, and may allow the second voltage regulator 552 to control oscillation frequencies of the second ILO 512 before quadrature lock is established during start-up conditions.

Figure 5B:
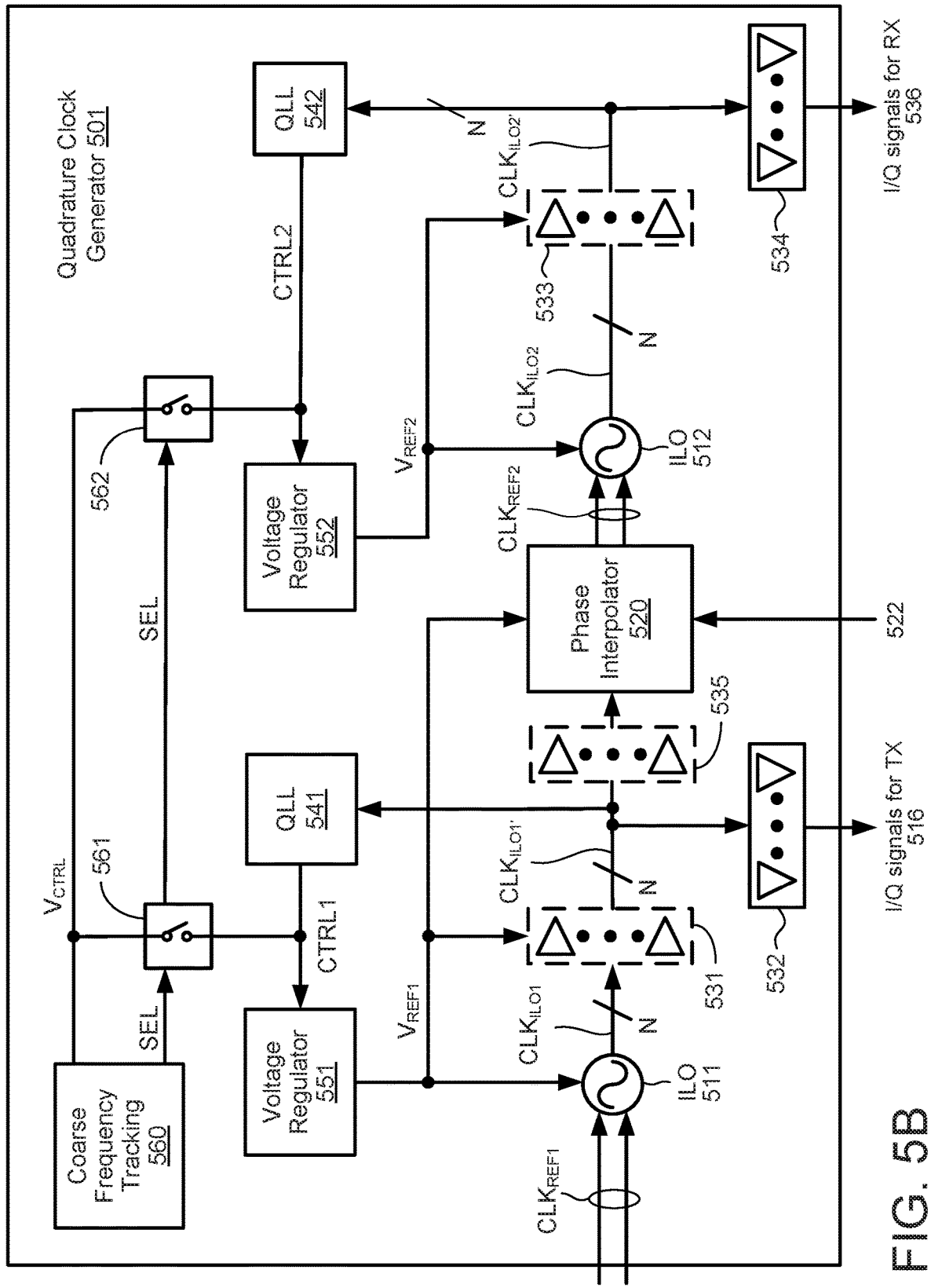
FIG. 5B shows a block diagram of another example quadrature clock generator, according to other implementations.

FIG. 5B shows a block diagram of another example quadrature clock generator 501, according to other implementations. The quadrature clock generator 501 is similar in many aspects to the quadrature clock generator 500 of FIG. 5A, except that the phase interpolator 520 may be controlled by the first reference voltage $V_{REF1}$, for example, rather than the second reference voltage $V_{REF2}$.

Figure 6:
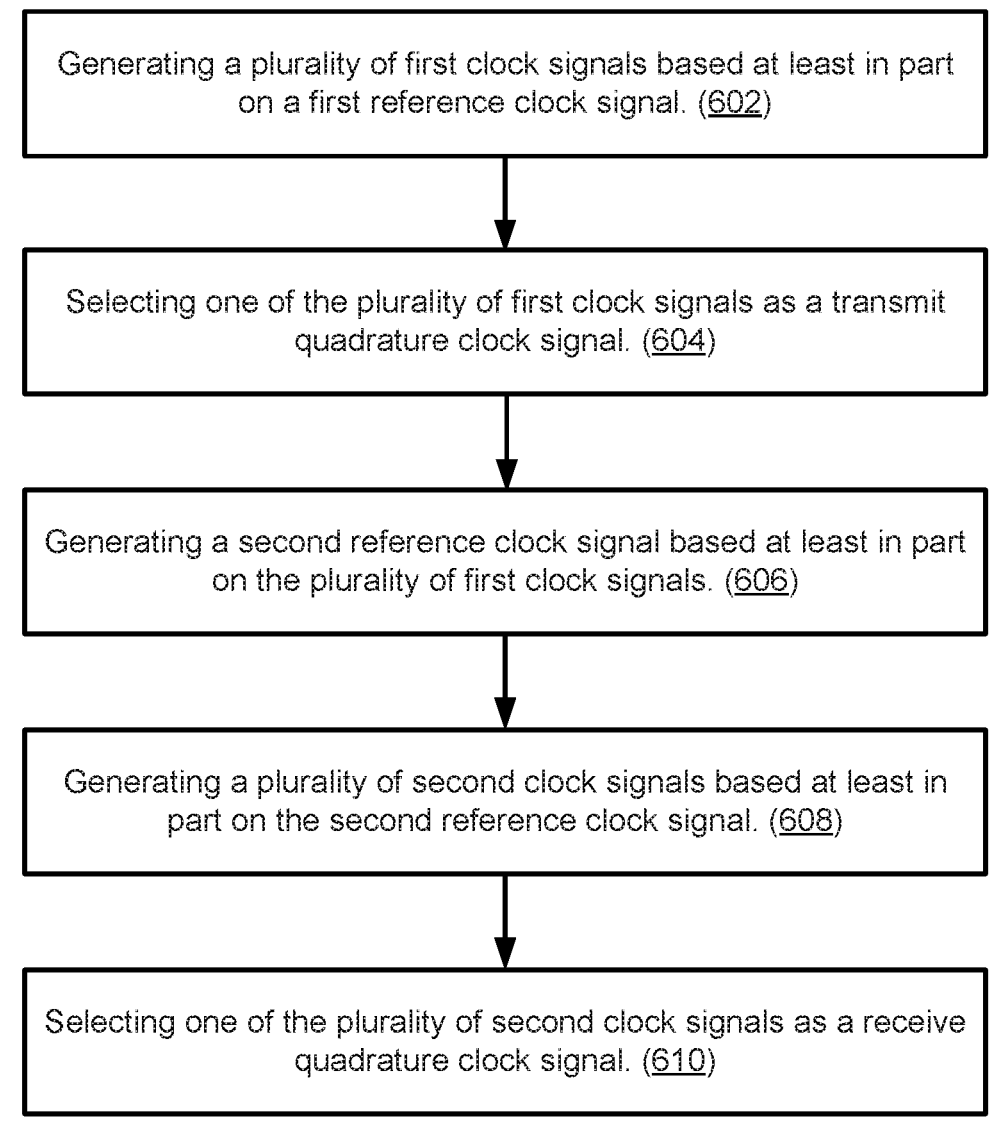
FIG. 6 shows an illustrative flowchart depicting an example operation for operating a quadrature clock generator, according to some implementations.

FIG. 6 shows an illustrative flowchart depicting an example operation 600 for operating a quadrature clock generator, according to some implementations. The operation 600 may be used to operate any suitable quadrature clock generator including, for example, the quadrature clock generator 400 of FIG. 4A, the quadrature clock generator 401 of FIG. 4B, the quadrature clock generator 500 of FIG. 5A, and the quadrature clock generator 501 of FIG. 5B. Thus, although described below with respect to the quadrature clock generator 400 of FIG. 4A, the quadrature clock generator 401 of FIG. 4B, the quadrature clock generator 500 of FIG. 5A, and the quadrature clock generator 501 of FIG. 5B, the example operation 600 may be used with other suitable quadrature clock generators.

The operation 600 may begin with generating a plurality of first clock signals based at least in part on a first reference clock signal (602). Referring also to FIGS. 4A and 4B, the first ILO 411 may generate a plurality of first clock signals $CLK_{ILO1}$ based on the first reference clock signal $CLK_{REF1}$. In some implementations, the first clock signals $CLK_{ILO1}$ may include an integer number of clock signals that may be selected for use as I and Q TX clock signals.

The operation 600 may proceed with selecting one of the plurality of first clock signals as a transmit quadrature clock signal (604). Referring also to FIGS. 4A and 4B, the select circuit 432 may select any suitable one of the first clock signals $CLK_{ILO1}$ to provide as the I/Q TX output clock signals 416. A transmit circuit, such as the transmit data processing block 220 of FIG. 2, may use the I/Q TX output clock signals 416 to encode or modulate data for transmission.

The operation 600 may proceed with generating a second reference clock signal based at least in part on the plurality of first clock signals (606). Referring also to FIGS. 4A and 4B, the phase interpolator 420 may use the first clock signals $CLK_{ILO1}$ provided by the first ILO 411 to generate a second reference clock signal $CLK_{REF2}$. In some implementations, the phase interpolator 420 may interpolate between a pair of adjacent clock signals of the plurality of first clock signals $CLK_{ILO1}$ to generate the second reference clock signal $CLK_{REF2}$, for example, so that the second reference clock signal $CLK_{REF2}$ may have an arbitrary phase relative to the first clock signals $CLK_{ILO1}$.

The operation 600 may proceed with generating a plurality of second clock signals based at least in part on the second reference clock signal (608). Referring also to FIGS. 4A and 4B, the second ILO 412 may generate a plurality of second clock signals $CLK_{ILO2}$ based on the second reference clock signal $CLK_{REF2}$. In some implementations, the second clock signals $CLK_{ILO2}$ may include an integer number of clock signals that may be selected for use as I and Q RX clock signals.

The operation 600 may proceed with selecting one of the plurality of second clock signals as a receive quadrature clock signa (610). Referring also to FIGS. 4A and 4B, the second select circuit 434 may select any suitable pair of the second clock signals $CLK_{ILO2}$ to provide as the I/Q RX output clock signals 436. A receive circuit, such as the receive data processing block 240 of FIG. 2, may use the I/Q RX output clock signals 436 to encode or modulate data for transmission.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A quadrature clock generator, comprising:
a first injection-locked oscillator configured to generate a plurality of first clock signals based at least in part on a first reference clock signal;
a first select circuit coupled to the first injection-locked oscillator and configured to select one of the first clock signals as a transmit quadrature clock signal;
a phase interpolator coupled to the first injection-locked oscillator and configured to generate a second reference clock signal based on a selected pair of the first clock signals;
a second injection-locked oscillator configured to generate a plurality of second clock signals based at least in part on the second reference clock signal; and a second select circuit coupled to the second injection-locked oscillator and configured to select one of the second clock signals as a receive quadrature clock signal.

2. The quadrature clock generator of claim 1, wherein the transmit quadrature clock signal comprises a first in-phase (I) component and a first quadrature (Q) component, and the receive quadrature clock signal comprises a second I component and a second Q component.

3. The quadrature clock generator of claim 1, wherein the transmit quadrature clock signal is provided to a transmit data processing block of an associated programmable device, and the receive quadrature clock signal is provided to a receive data processing block of the associated programmable device.

4. The quadrature clock generator of claim 3, wherein the phase interpolator is configured to generate the second reference clock signal based at least in part on an input signal provided by the receive data processing block.

5. The quadrature clock generator of claim 1, wherein each of the plurality of first clock signals is offset in phase from each other by forty-five degrees, and each of the plurality of second clock signals is offset in phase from each other by forty-five degrees.

6. The quadrature clock generator of claim 1, wherein the first injection-locked oscillator, the phase interpolator, and the second injection-locked oscillator are controlled, at least in part, by a reference voltage.

7. The quadrature clock generator of claim 6, further comprising:
a quadrature-locked loop (QLL) configured to generate a control signal based at least in part on the plurality of second clock signals; and
a voltage regulator configured to generate the reference voltage based at least in part on the control signal.

8. The quadrature clock generator of claim 7, further comprising a coarse frequency tracking circuit configured to selectively disable the control signal based at least in part on detecting a start-up condition.

9. The quadrature clock generator of claim 8, wherein the voltage regulator is configured to control oscillation frequencies of the first injection-locked oscillator and the second injection-locked oscillator before quadrature lock is established during the detected start-up condition.

10. The quadrature clock generator of claim 1, wherein:
the first injection-locked oscillator is controlled, at least in part, by a first reference voltage; and
the phase interpolator and the second injection-locked oscillator are controlled, at least in part, by a second reference voltage.

11. The quadrature clock generator of claim 10, further comprising:
a first quadrature-locked loop (QLL) configured to generate a first control signal based at least in part on the plurality of first clock signals;
a first voltage regulator configured to generate the first reference voltage based at least in part on the first control signal;
a second QLL configured to generate a second control signal based at least in part on the plurality of second clock signals; and
a second voltage regulator configured to generate the second reference voltage based at least in part on the second control signal.

12. The quadrature clock generator of claim 11, further comprising a coarse frequency tracking circuit configured to selectively disable the first and second control signals based at least in part on detecting a start-up condition.

13. A programmable logic device, comprising:
a transmit data processing block configured to transmit data using a transmit quadrature clock signal;
a receive data processing block configured to receive data using a receive quadrature clock signal; and
a quadrature clock generator, coupled to the transmit data processing block and to the receive data processing block, comprising:
a first injection-locked oscillator configured to generate a plurality of first clock signals based at least in part on a first reference clock signal;
a first select circuit configured to select one of the first clock signals as the transmit quadrature clock signal;
a phase interpolator coupled to the first injection-locked oscillator and configured to generate a second reference clock signal based on a selected pair of the first clock signals;
a second injection-locked oscillator configured to generate a plurality of second clock signals based at least in part on the second reference clock signal; and
a second select circuit configured to select one of the second clock signals as the receive quadrature clock signal.

14. The programmable logic device of claim 13, wherein the first injection-locked oscillator, the phase interpolator, and the second injection-locked oscillator are controlled, at least in part, by a reference voltage.

15. The programmable logic device of claim 14, further comprising:
a quadrature-locked loop (QLL) configured to generate a control signal based at least in part on the plurality of second clock signals; and
a voltage regulator configured to generate the reference voltage based at least in part on the control signal.

16. The programmable logic device of claim 15, further comprising a coarse frequency tracking circuit configured to selectively disable the control signal based at least in part on detecting a start-up condition.

17. A method for operating a quadrature clock generator, comprising:
generating a plurality of first clock signals based at least in part on a first reference clock signal;
selecting one of the plurality of first clock signals as a transmit quadrature clock signal;
generating a second reference clock signal by interpolating between a pair of the plurality of first clock signals;
generating a plurality of second clock signals based at least in part on the second reference clock signal; and
selecting one of the plurality of second clock signals as a receive quadrature clock signal.

18. The method of claim 17, wherein the second reference clock signal is generated based at least in part on an input signal from a receive data processing block.

19. The method of claim 17, wherein each of the plurality of first clock signals is offset from a corresponding one of the plurality of second clock signals by forty-five degrees.

* * * * *